United States Patent
Kanda et al.

(10) Patent No.: US 12,157,951 B2
(45) Date of Patent: Dec. 3, 2024

(54) PLATING METHOD, INSOLUBLE ANODE FOR PLATING, AND PLATING APPARATUS

(71) Applicant: EBARA CORPORATION, Tokyo (JP)

(72) Inventors: Hiroyuki Kanda, Tokyo (JP); Naoki Shimomura, Tokyo (JP); Mizuki Nagai, Tokyo (JP); Shingo Yasuda, Tokyo (JP); Akira Owatari, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 332 days.

(21) Appl. No.: 17/608,363

(22) PCT Filed: May 13, 2020

(86) PCT No.: PCT/JP2020/019040
§ 371 (c)(1),
(2) Date: Nov. 2, 2021

(87) PCT Pub. No.: WO2020/235406
PCT Pub. Date: Nov. 26, 2020

(65) Prior Publication Data
US 2022/0228285 A1   Jul. 21, 2022

(30) Foreign Application Priority Data
May 17, 2019   (JP) ................................ 2019-093404

(51) Int. Cl.
*C25D 17/12*   (2006.01)
*C25D 7/12*   (2006.01)
(Continued)

(52) U.S. Cl.
CPC ............. *C25D 17/12* (2013.01); *C25D 7/123* (2013.01); *C25D 17/002* (2013.01); *C25D 21/12* (2013.01); *H01L 21/2885* (2013.01)

(58) Field of Classification Search
CPC .. C25D 17/002; C25D 17/005; C25D 17/001; C25D 17/12
See application file for complete search history.

(56) References Cited

U.S. PATENT DOCUMENTS

| | | | |
|---|---|---|---|
| 9,028,657 B2* | 5/2015 | Feng .................... | C25D 17/001 204/280 |
| 2005/0161336 A1* | 7/2005 | Woodruff ............... | C25D 17/12 204/224 R |

(Continued)

FOREIGN PATENT DOCUMENTS

| | | |
|---|---|---|
| CN | 100539011 C | 9/2009 |
| CN | 104818513 A | 8/2015 |

(Continued)

OTHER PUBLICATIONS

Machine translation of JP2003-073889. (Year: 2003).*
International Patent Application No. PCT/JP2020/019040; Int'l Search Report; dated Jul. 21, 2020; 2 pages.

*Primary Examiner* — Brian W Cohen
(74) *Attorney, Agent, or Firm* — BakerHostetler

(57) ABSTRACT

Provided are a plating method, an insoluble anode and a plating apparatus capable of reducing consumption of an additive in a plating solution, when plating a substrate including a via or a hole for forming a through electrode. The plating method includes the steps of preparing a substrate including a via or a hole for forming a through electrode, preparing a plating solution tank that is divided, by a diaphragm, into an anode tank in which an insoluble anode is disposed and a cathode tank in which the substrate is disposed, and electroplating the substrate with an anode current density when plating the substrate in the plating solution tank being equal to or more than 0.4 ASD and equal to or less than 1.4 ASD.

7 Claims, 11 Drawing Sheets

(51) Int. Cl.
*C25D 17/00* (2006.01)
*C25D 21/12* (2006.01)
*H01L 21/288* (2006.01)

(56) References Cited

U.S. PATENT DOCUMENTS

| | | | |
|---|---|---|---|
| 2008/0121526 A1 | 5/2008 | Hsiao et al. | |
| 2009/0211900 A1* | 8/2009 | Rash | C25D 17/10 |
| | | | 204/276 |
| 2014/0299476 A1* | 10/2014 | Yasuda | C25D 5/18 |
| | | | 205/131 |
| 2015/0218723 A1 | 8/2015 | Miura et al. | |
| 2015/0275390 A1 | 10/2015 | Tsujino et al. | |
| 2016/0369421 A1 | 12/2016 | Yahagi et al. | |

FOREIGN PATENT DOCUMENTS

| | | |
|---|---|---|
| CN | 105980612 A | 9/2016 |
| JP | H07-011498 A | 1/1995 |
| JP | 2003-073889 A | 3/2003 |
| JP | 2007-262448 A | 10/2007 |
| JP | 2014-201835 A | 10/2014 |
| TW | 201533276 A | 9/2015 |
| TW | 1589204 B | 6/2017 |

\* cited by examiner

PLATING METHOD, INSOLUBLE ANODE FOR PLATING, AND PLATING APPARATUS

TECHNICAL FIELD

The present invention relates to a plating method, an insoluble anode for plating, and a plating apparatus.

BACKGROUND ART

Heretofore, a wiring has been formed in a fine wiring groove, hole or resist opening provided in a surface of a semiconductor wafer or the like, and a bump (a protruding electrode) to be electrically connected to an electrode of a package or the like has been formed on the surface of the semiconductor wafer or the like. As a method of forming this wiring and bump, for example, an electroplating method, an evaporation method, a printing method, a ball bump method or the like is known, but with increase in an I/O number of semiconductor chips and for a finer pitch, the electroplating method is becoming often used in which miniaturization is possible and performance is relatively stable.

A plating apparatus for use in the electroplating method includes a substrate holder holding a substrate of a semiconductor wafer or the like, an anode holder holding an anode, and a plating solution tank that stores a plating solution containing a large number of types of additives. When a substrate surface of the semiconductor wafer or the like is plated in this plating apparatus, the substrate holder is disposed to face the anode holder in the plating solution tank. In this state, the substrate and the anode are energized, and accordingly a plating film is formed on the substrate surface. In addition, the additive has an effect of accelerating or suppressing a film formation speed of the plating film, an effect of improving film quality of the plating film, and the like.

Heretofore, a soluble anode that dissolves in the plating solution or an insoluble anode that does not dissolve in the plating solution has been used as the anode. In a case where the plating is performed by using the insoluble anode, oxygen is generated by reaction between the anode and the plating solution. The additive in the plating solution reacts with this oxygen and is decomposed. There is a problem that, when the additive is decomposed, the additive loses the above-described effects, and a desired film cannot be obtained on the substrate surface (e.g., see PTL 1). To prevent this problem, the additive may be added to the plating solution as required to keep concentration of the additive in the plating solution in a predetermined concentration or more. However, the additive is expensive, and hence it is desirable to inhibit the decomposition of the additive as much as possible.

Furthermore, a technology of forming a plurality of through electrodes made of a metal such as copper and extending through the substrate in an up-down direction in an interior of the substrate is known as means for conducting between respective layers when stacking a conductor substrate on each of multiple layers (e.g., see PTL 1). FIG. 14 is a diagram showing an example of manufacturing a substrate including a through electrode. First, as shown in FIG. 14A, a substrate W is prepared in which a plurality of recesses 112 for through electrodes that open upward are formed in an interior of a base material 110 made of silicon or the like, for example, by a lithography and etching technology. Each of the recesses 112 for the through electrodes has a diameter, for example, from 1 to 100 μm, especially from 10 to 20 μm, and a depth, for example, from 70 to 150 μm. Then, a seed layer 114 made of copper or the like is formed as a power supply layer for electroplating on the surface of the substrate W by sputtering or the like.

Next, the surface of the substrate W is electroplated with copper, and as shown in FIG. 14B, an interior of each recess 112 for the through electrode of the substrate W is filled with a copper plating film 116, and the copper plating film 116 is deposited on the surface of the seed layer 114.

Afterward, as shown in FIG. 14C, excessive portions of the copper plating film 116 and seed layer 114 on the base material 110 are removed by chemical mechanical polishing (CMP) or the like, and additionally, a back surface side of the base material 110 is polished and removed until a bottom surface of the copper plating film 116 with which the interior of the recess 112 for the through electrode is filled is exposed to outside. Consequently, the substrate W is completed in which a plurality of through electrodes 118 made of copper (the copper plating films 116) and extending through the substrate in the up-down direction are included.

In the recess 112 for the through electrode, a ratio of a depth to a diameter, that is an aspect ratio, is generally large, and it usually takes long period of time to completely fill the interior of the recess 112 for the through electrode having such a large aspect ratio with the copper film (the plating film) formed by electroplating without causing a defect such as a void in the recess.

CITATION LIST

Patent Literature

PTL 1: Japanese Patent Laid-Open No. 7-11498

SUMMARY OF INVENTION

Technical Problem

Heretofore, a method of increasing a surface area of an anode and decreasing an anode current density during plating has been performed as a method of decreasing an amount of oxygen to be generated around the anode to reduce consumption of an additive in a plating solution. Here, when a substrate including a via or a hole having a large aspect ratio for forming a through electrode is plated, a current during plating is reduced so that a defect such as a void is not caused. However, according to investigation by present inventors, it has been found that the consumption of the additive might increase even during the plating of the substrate in which the through electrode is to be formed. More specifically, according to the investigation by the present inventors, it has been seen that, when the anode current density during the plating is excessively small, the generation of oxygen decreases, but instead, generation of hypochlorous acid increases, and decomposition of the additive is accelerated due to effect of increased hypochlorous acid.

Furthermore, in a case where the surface area of the anode is changed to regulate the anode current density to reduce the consumption of the additive, there is concern that, when the surface area of the anode is simply changed, uniformity of plating formed on the substrate might be impaired.

The present invention has been developed in view of the above problems, and one of objects thereof is to provide a plating method, an insoluble anode and a plating apparatus capable of reducing consumption of an additive in a plating solution, when plating a substrate including a via or a hole for forming a through electrode.

Solution to Problem

According to an embodiment of the present invention, a plating method is provided, and the plating method includes the steps of preparing a substrate including a via or a hole for forming a through electrode, preparing a plating solution tank that is divided, by a diaphragm, into an anode tank in which an insoluble anode is disposed and a cathode tank in which the substrate is disposed, and electroplating the substrate with an anode current density when plating the substrate in the plating solution tank being equal to or more than 0.4 ASD (A/cm$^2$) and equal to or less than 1.4 ASD. According to this plating method, generation of oxygen and hypochlorous acid during the plating can be inhibited, and consumption of an additive in a plating solution can be reduced.

According to another embodiment of the present invention, an insoluble anode for plating that is disposed in a plating solution tank for use in the plating is provided, and the insoluble anode includes a power supply point to be connected to a power source, a ring electrode having a ring shape around the power supply point, and a connection electrode connecting the power supply point and the ring electrode. According to this insoluble anode for plating, generation of oxygen and hypochlorous acid during the plating can be inhibited, and consumption of an additive in a plating solution can be reduced. Furthermore, in-plane uniformity of plating formed on the substrate can be improved.

DESCRIPTION OF EMBODIMENTS

Hereinafter, embodiments of a plating method, an insoluble anode for plating and a plating apparatus according to the present invention will be described with reference to the accompanying drawings. In the accompanying drawings, the same or similar element is denoted with the same or similar reference sign, and in descriptions of the respective embodiments, a description concerning the same or similar element may not be repeated. Also, characteristics illustrated in the respective embodiments are also applicable to another embodiment as long as the characteristics of the embodiments are not contradictory to each other.

First Embodiment

Figure 1:
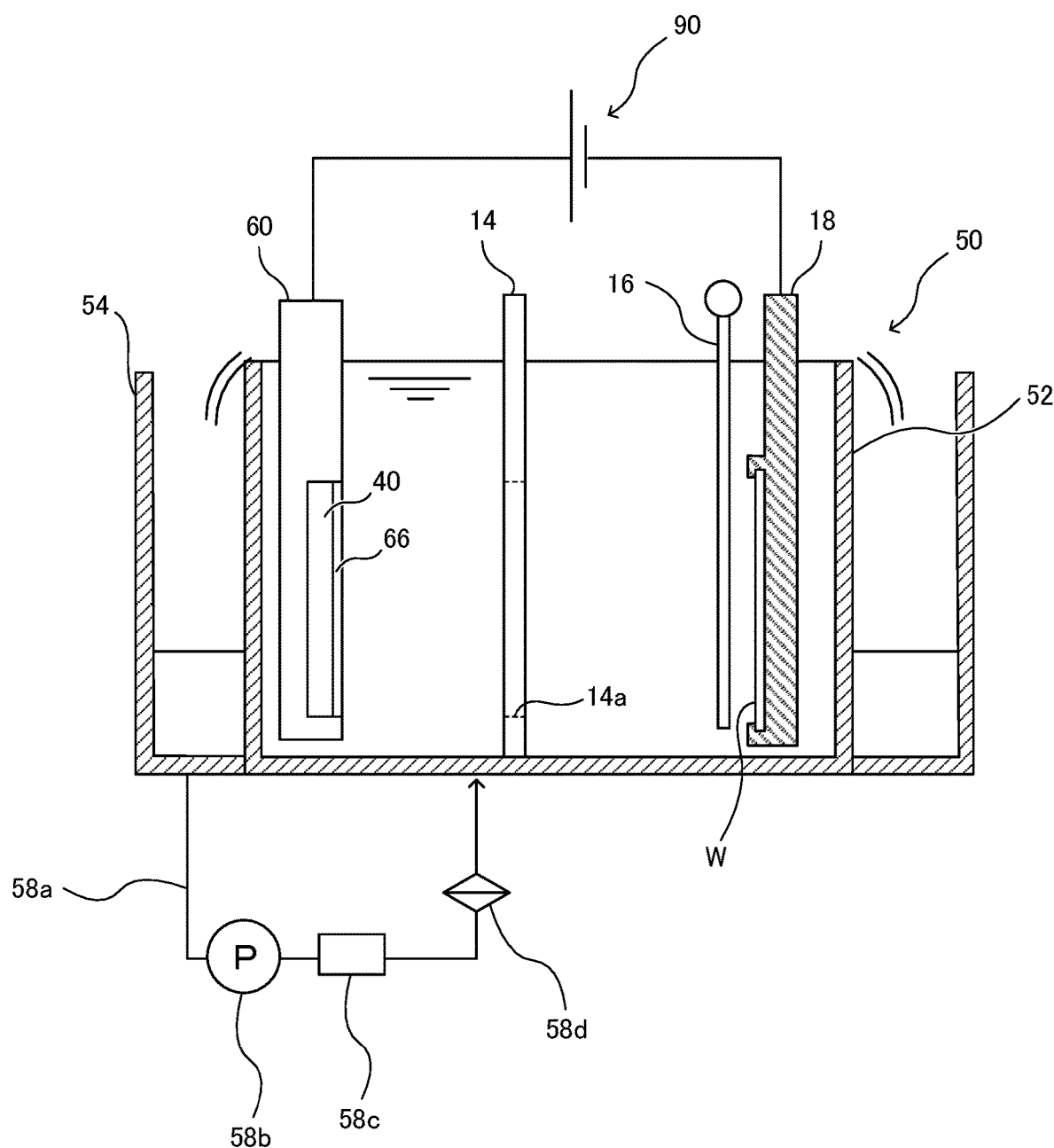
FIG. 1 is a schematic view showing a plating apparatus according to a first embodiment.

FIG. 1 is a schematic view showing a plating apparatus according to a first embodiment. As shown in FIG. 1, the plating apparatus includes a plating solution tank 50 holding a plating solution inside, an anode 40 disposed in the plating solution tank 50, an anode holder 60 holding the anode 40, and a substrate holder 18. The substrate holder 18 removably holds a substrate W such as a wafer, and is configured to immerse the substrate W into the plating solution in the plating solution tank 50. The plating apparatus according to the present embodiment is an electroplating apparatus that applies current through the plating solution to plate a surface of the substrate W with a metal. As the anode 40, used is an insoluble anode made of, for example, titanium coated with iridium oxide or platinum that does not dissolve in the plating solution.

The substrate W is, for example, a semiconductor substrate, a glass substrate, or a resin substrate. The metal with which the surface of the substrate W is plated is, for example, copper (Cu), nickel (Ni), tin (Sn), Sn—Ag alloy, or cobalt (Co).

The anode 40 and the substrate W are arranged to extend in a vertical direction, that is, so that plate surfaces of the anode 40 and the substrate W face in a horizontal direction and face each other in the plating solution. The anode 40 is connected to a positive electrode of a power source 90 via the anode holder 60, and the substrate W is connected to a negative electrode of the power source 90 via the substrate holder 18. When a voltage is applied between the anode 40 and the substrate W, current flows to the substrate W, and a metal film is formed on the surface of the substrate W in the presence of the plating solution.

The plating solution tank 50 includes a plating solution storage tank 52 in which the substrate W and the anode 40 are arranged, and an overflow tank 54 disposed adjacent to the plating solution storage tank 52. The plating solution in the plating solution storage tank 52 flows over a side wall of the plating solution storage tank 52 to flow into the overflow tank 54.

One end of a plating solution circulation line 58a is connected to a bottom of the overflow tank 54, and the other end of the plating solution circulation line 58a is connected to a bottom of the plating solution storage tank 52. A circulation pump 58b, a constant temperature unit 58c and a filter 58d are attached to the plating solution circulation line 58a. The plating solution flows over the side wall of the plating solution storage tank 52 to flow into the overflow tank 54, and further flows from the overflow tank 54 through the plating solution circulation line 58a to return to the plating solution storage tank 52. Thus, the plating solution circulates between the plating solution storage tank 52 and the overflow tank 54 through the plating solution circulation line 58a.

The plating apparatus further includes a regulation plate 14 that regulates a potential distribution on the substrate W, and a paddle 16 that stirs the plating solution in the plating solution storage tank 52. The regulation plate 14 is disposed between the paddle 16 and the anode 40, and includes an opening 14a for limiting an electric field in the plating solution. The paddle 16 is disposed in the vicinity of the surface of the substrate W held by the substrate holder 18 in the plating solution storage tank 52. The paddle 16 is made of, for example, titanium (Ti) or resin. The paddle 16 reciprocates in parallel with the surface of the substrate W, to stir the plating solution so that metal ions are sufficiently and uniformly supplied to the surface of the substrate W during the plating of the substrate W.

Figure 2:
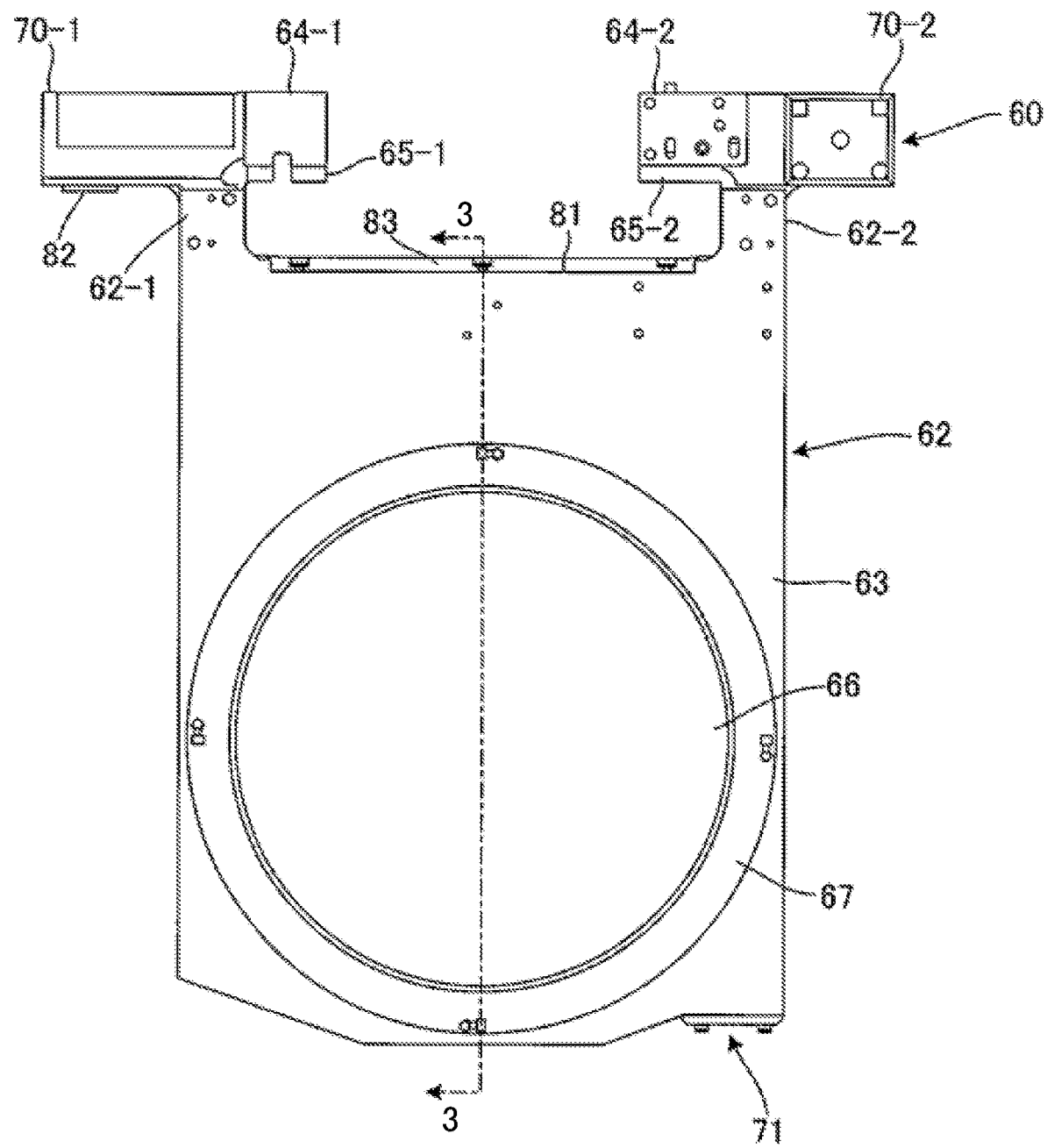
FIG. 2 is a plan view of an anode holder according to the present embodiment.
Figure 3:
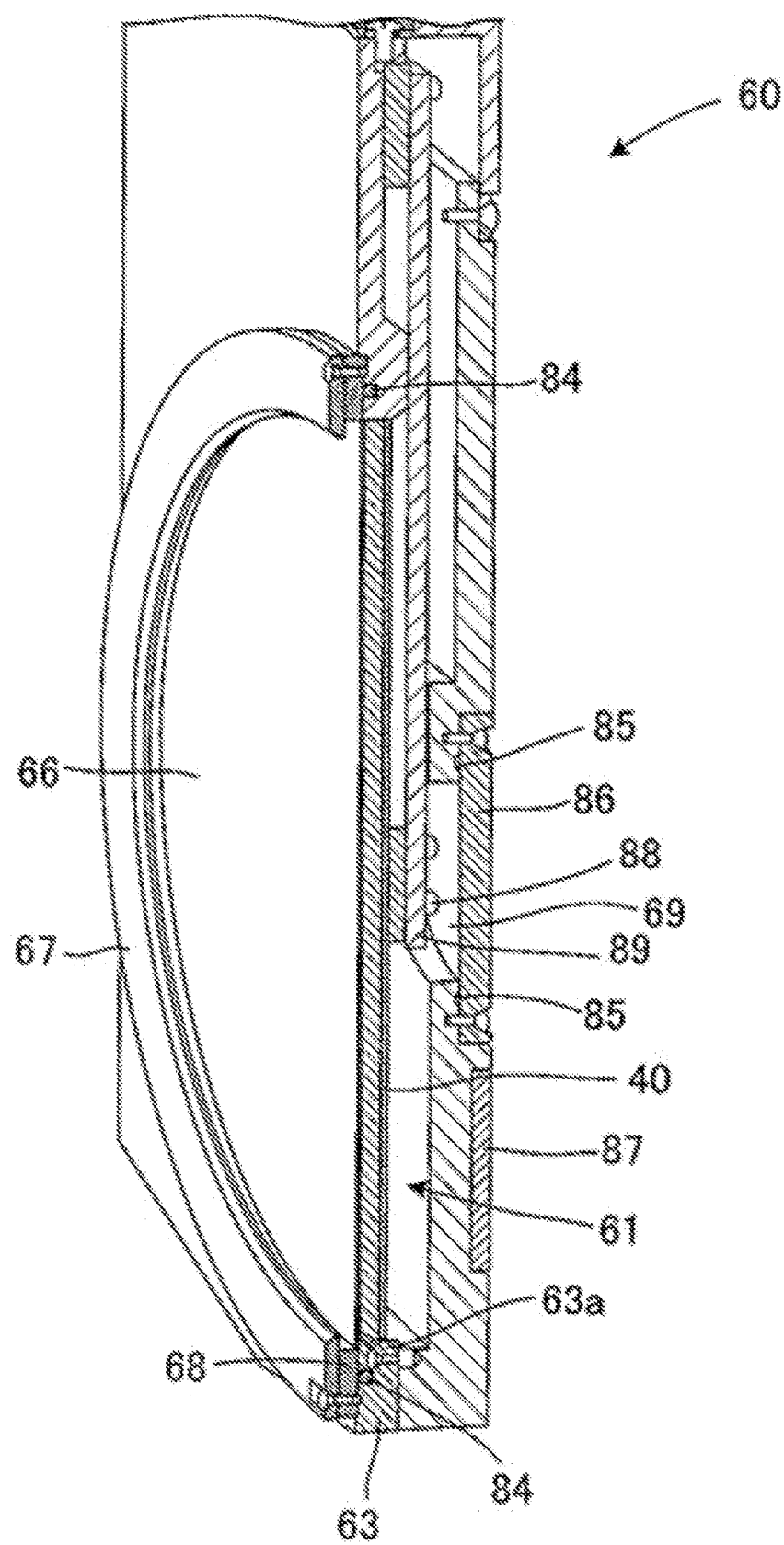
FIG. 3 is a side cross-sectional view of an anode holder 60 taken along the 3-3 line shown in FIG. 2.
Figure 4:
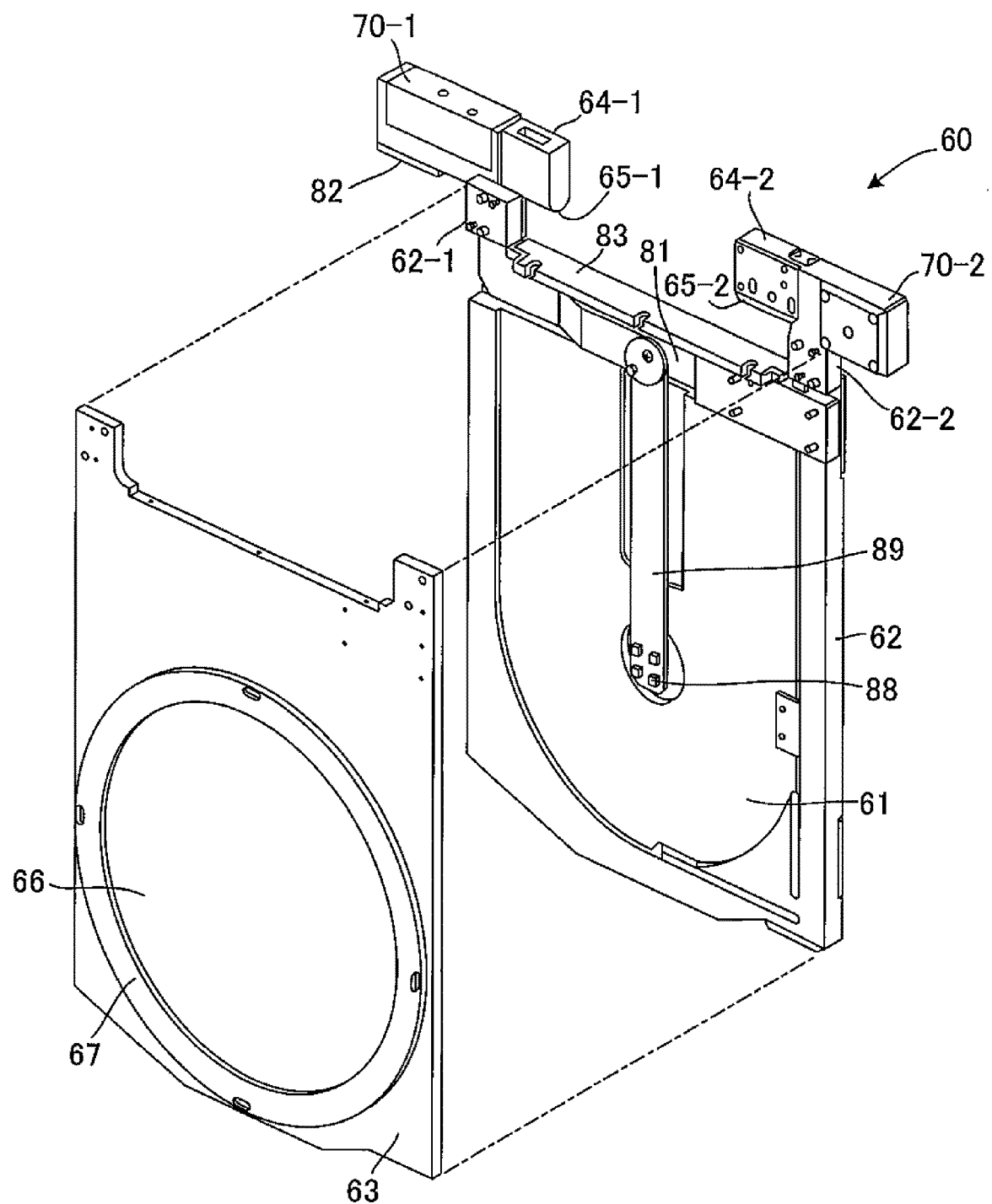
FIG. 4 is an exploded perspective view of the anode holder in a state where a holder base cover is removed.
Figure 5:
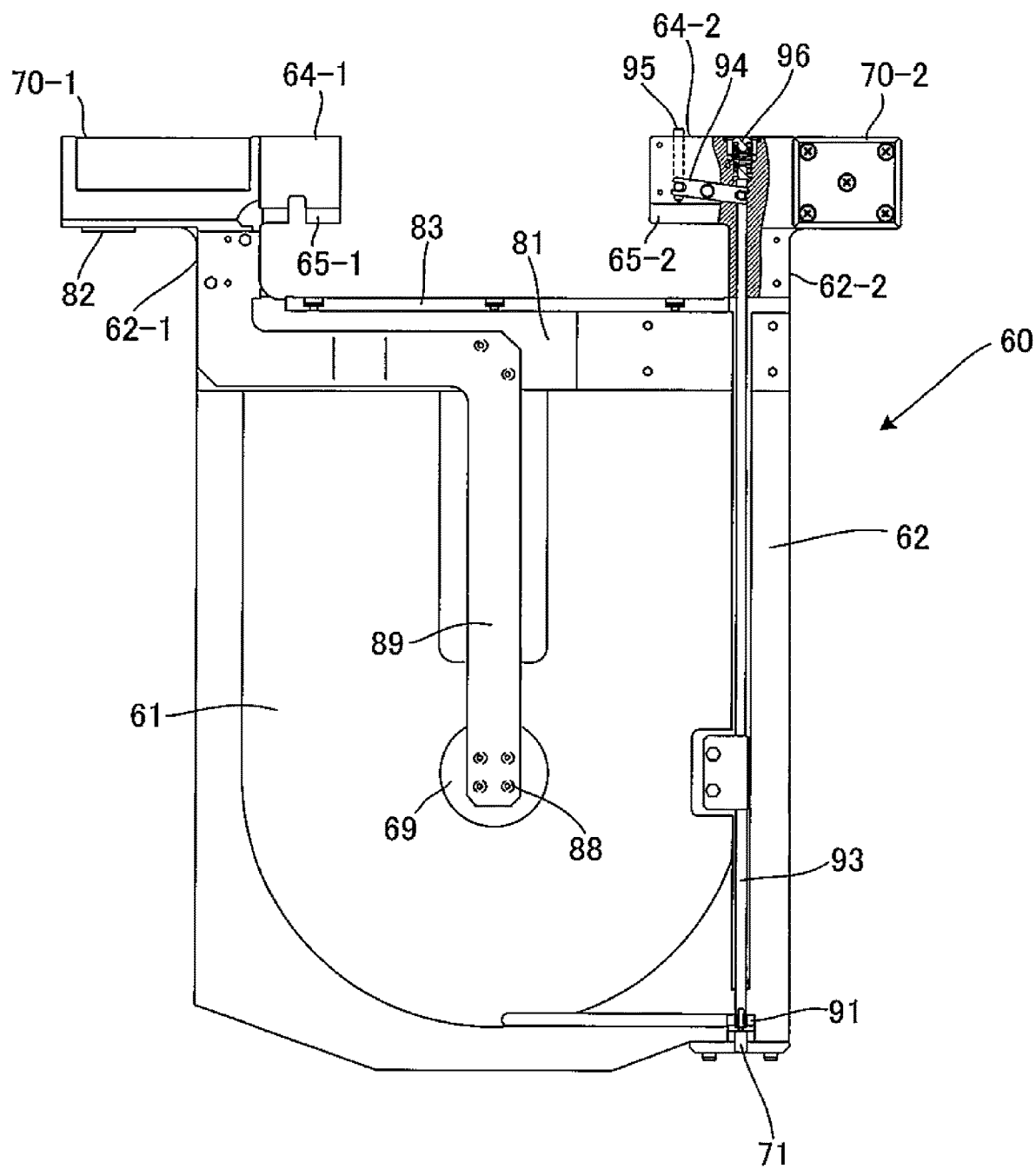
FIG. 5 is a plan view of the anode holder in the state where the holder base cover is removed.

FIG. 2 is a plan view of the anode holder 60, FIG. 3 is a side cross-sectional view of the anode holder 60 taken along the 3-3 line shown in FIG. 2, FIG. 4 is an exploded perspective view of the anode holder 60 in a state where a holder base cover 63 is removed, and FIG. 5 is a plan view of the anode holder 60 in the state where the holder base cover 63 is removed. Note that FIG. 5 shows, for convenience, the anode holder 60 in a state where a grip 64-2 is transparent. Furthermore, FIGS. 4 and 5 show, for convenience, the anode holder 60 in a state where the anode 40 is removed. Further, in the present description, "up" and "down" refer to an upward direction and a downward direction in a state where the anode holder 60 is vertically housed in the plating solution tank 50. Similarly, in the present description, "a front surface" refers to a surface on a side on which the anode holder 60 faces the substrate holder, and "a back surface" refers to a surface on a side opposite to the front surface.

As shown in FIGS. 2 to 4, the anode holder 60 according to the present embodiment includes a substantially rectangular holder base 62 including an inner space 61 that houses the anode 40, a pair of grips 64-1 and 64-2 formed in an upper part of the holder base 62, and a pair of arms 70-1 and 70-2 similarly formed in the upper part of the holder base 62. Also, the anode holder 60 includes the holder base cover 63 that partially covers a front surface of the holder base 62, a diaphragm 66 disposed on a front surface of the holder base cover 63 to cover the inner space 61, and an outer edge mask 67 disposed on a front surface of the diaphragm 66. Additionally, in the present embodiment, the inner space 61 of the anode holder 60 corresponds to "an anode tank", and an outer space corresponds to "a cathode tank".

As shown in FIGS. 2 and 5, the holder base 62 includes a hole 71 extending from an outer surface of a lower part to the inner space 61 of the holder base, and communicating with the inner space 61. Also, the holder base 62 includes an air outlet 81 for exhausting air of the inner space 61, between the grips 64-1 and 64-2 in the upper part of the holder base. When the holder base 62 is immersed into the plating solution, the plating solution flows through the hole 71 into the inner space 61, and air of the inner space 61 is exhausted from the air outlet 81. Furthermore, in a case where the insoluble anode is used as the anode 40, oxygen generated from the anode 40 during the plating is also exhausted through the air outlet 81. The air outlet 81 is closed with a lid 83 formed so that the exhaust of air is not obstructed.

Also, as shown in FIG. 3, an annular opening 63a having a diameter larger than a diameter of the anode 40 is formed in a substantially central portion of the holder base cover (base body) 63. The holder base cover 63 forms the inner space 61 together with the holder base 62. The diaphragm 66 is disposed on a front surface of the opening 63a, to close the inner space 61. A diaphragm retainer 68 is attached in front of an outer peripheral edge of the diaphragm 66, and the outer edge mask 67 is disposed in front of the diaphragm retainer 68. Also, an annular first sealing member 84 including, for example, an O-ring or the like is disposed along the opening 63a in the front surface of the holder base cover 63. The diaphragm 66 is pressed onto the first sealing member 84 by the diaphragm retainer 68, to seal the opening 63a. That is, a gap between the diaphragm 66 and the inner space 61 can be sealed with the first sealing member 84. Consequently, the inner space 61 and the outer space are divided by the diaphragm 66.

The diaphragm 66 is, for example, an ion exchange membrane such as a cation exchange membrane, or a neutral diaphragm. During plating, cations can pass through the diaphragm 66 from an anode side to a cathode side while any additive in the plating solution does not pass. A specific example of the diaphragm 66 is YUMICRON (registered trademark) manufactured by Yuasa Membrane Systems Co., Ltd.

The outer edge mask 67 is a plate-shaped member including an annular opening in a central portion, and is detachably attached to a front surface of the diaphragm retainer 68. The outer edge mask 67 is disposed to control the electric field in the surface of the anode 40 during the plating. The outer edge mask 67 may have a diameter of the opening that is larger than an outer diameter of the anode 40, and may have an outer shape smaller than an outer shape of the anode 40. Alternatively, the anode holder 60 does not have to include the outer edge mask 67.

The holder base cover 63 is fixed to the holder base 62 by screw connection, welding or the like, and the holder base cover 63 is closely connected to the holder base 62. Alternatively, the holder base cover 63 may be formed integrally with the holder base 62.

As shown in FIGS. 2, 4 and 5, the grips 64-1 and 64-2 are coupled with the holder base 62 via couplings 62-1 and 62-2 formed in the upper part of the holder base 62. The grips 64-1 and 64-2 are formed to extend from the couplings 62-1 and 62-2 toward a center of the holder base 62. The grips 64-1 and 64-2 are gripped with an unshown chuck, when the anode holder 60 is conveyed to the plating solution tank 50.

An electrode terminal 82 for applying a voltage to the anode 40 is disposed in a lower part of the arm 70-1 extending outward from the couplings 62-1 and 62-2. The electrode terminal 82 is connected to the positive electrode of the power source 90, when the anode holder 60 is housed in the plating solution tank. Also, the anode holder 60 includes a power supply member 89 extending from the electrode terminal 82 to a substantially central portion of the inner space 61. The power supply member 89 is a substantially plate-shaped conductive member, and electrically connected to the electrode terminal 82.

As shown in FIG. 3, the anode 40 is fixed to a front surface of the power supply member 89 with a fixing member 88 including, for example, a screw and the like. Consequently, the voltage can be applied from the power source 90 to the anode 40 via the electrode terminal 82 and the power supply member 89.

An annular opening 62a for changing the anode 40 is formed in a substantially central portion of the holder base 62, that is, at a position corresponding to the fixing member 88. The opening 62a communicates with a back surface side of the inner space 61, and is covered with a lid 86. On a back surface side of the holder base 62, an annular second sealing member 85 including, for example, an O-ring or the like is disposed along the opening 62a. A gap between the opening 62a and the lid 86 is sealed with the second sealing member 85.

The lid 86 is removed when the anode 40 is changed. Specifically, for example, with elapse of useful life of the anode 40, an operator removes the lid 86, and removes the fixing member 88 via the opening 62a. The operator removes the outer edge mask 67 from the diaphragm retainer 68, and removes the anode 40 from the inner space 61. Subsequently, the operator houses another anode 40 in the inner space 61, and fixes the anode 40 to the front surface of the power supply member 89 with the fixing member 88 via the opening 62a. Lastly, the operator seals the opening 62a with the lid 86, and attaches the outer edge mask 67 to the diaphragm retainer 68.

A weight 87 is attached to a back surface of the holder base 62. Consequently, the anode holder 60 can be prevented from floating on a surface of water due to buoyancy, when the anode holder 60 is immersed into the plating solution.

As shown in FIG. 5, the anode holder 60 further includes a valve 91 configured to seal the hole 71, a spring 96 for biasing the valve 91 to close the valve 91, a shaft 93 for transmitting biasing force of the spring 96 to the valve 91, a push rod 95 as an operation member that operates the valve 91 to open and close the valve, and an intermediate member 94 for transmitting, to the shaft 93, force applied to the push rod 95.

The valve 91 is disposed in the holder base 62 so that the hole 71 can be sealed on an inner side of the holder base 62. The shaft 93 is disposed along an up-down direction in the holder base 62. The shaft 93 has one end coupled to the valve 91, and the other end coupled to the spring 96. Consequently, the shaft 93 transmits the biasing force of the spring 96 to the valve 91, and the valve 91 is biased so that the hole 71 is sealed with the valve 91 on the inner side of the holder base 62.

Thus, the anode holder 60 includes the valve 91 that seals the hole 71, so that the hole 71 can be sealed, after the anode holder 60 is immersed into the plating solution to fill the inner space 61 with the plating solution. Consequently, if oxygen, hypochlorous acid or monovalent copper is generated in the vicinity of the anode 40, proceeding of decomposition of the additive can be inhibited, because the outer space and the inner space 61 are divided. Alternatively, in the plating apparatus, the anode holder 60 may be disposed in the plating solution storage tank 52 in a state where a base liquid is put in the plating solution storage tank 52, the inner space 61 of the anode holder 60 may be filled with the base liquid and then sealed, and a liquid containing the additive may be put in the plating solution storage tank 52 to prepare the plating solution in the outer space. In this case, the inner space 61 of the anode holder 60 does not store the additive, and hence consumption of the additive in the vicinity of the anode 40 can be reduced more. However, the present invention is not limited to this example, and the anode holder 60 may be disposed in the plating solution storage tank 52 in a state where the plating solution containing the additive is put in the plating solution storage tank 52, and the inner space 61 of the anode holder 60 may be filled with the plating solution containing the additive and then sealed.

Figure 6:
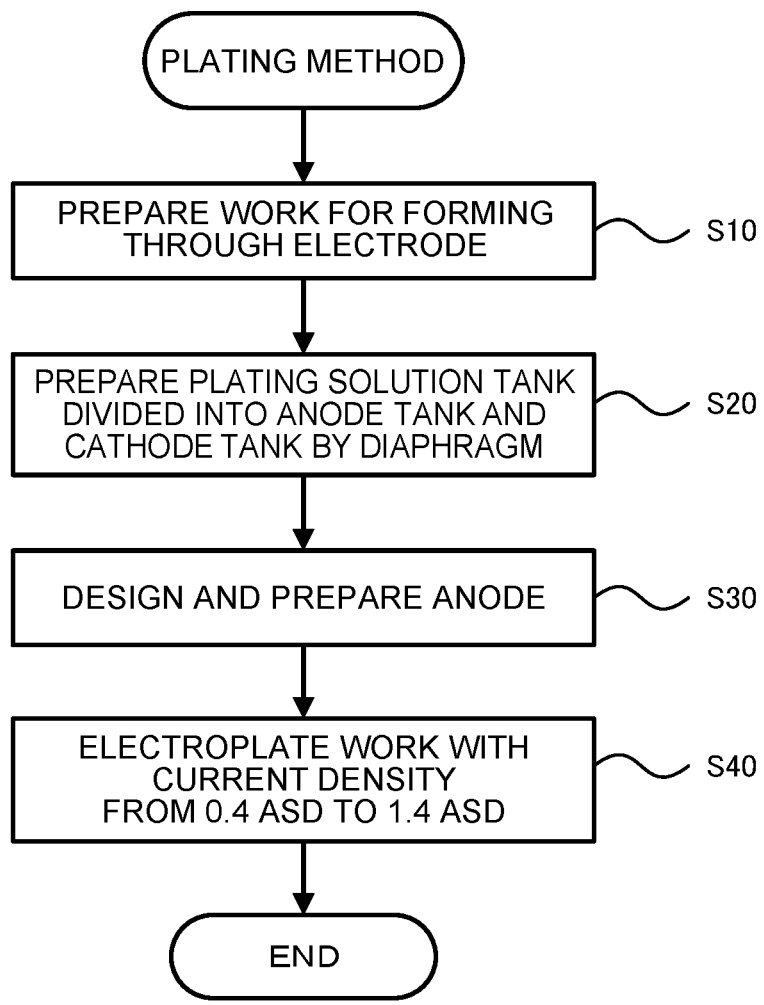
FIG. 6 is a flowchart showing an example of a plating method in the present embodiment.

Next, a description will be made as to a plating method of the present embodiment with reference to FIG. 6. Note that in the following description, steps are described in order for ease of a description, but the plating method is not limited to the steps to be executed in order as in FIG. 6 and the following description. That is, the respective steps may be executed by changing the order of the steps unless there is any contradiction.

Figure 14:
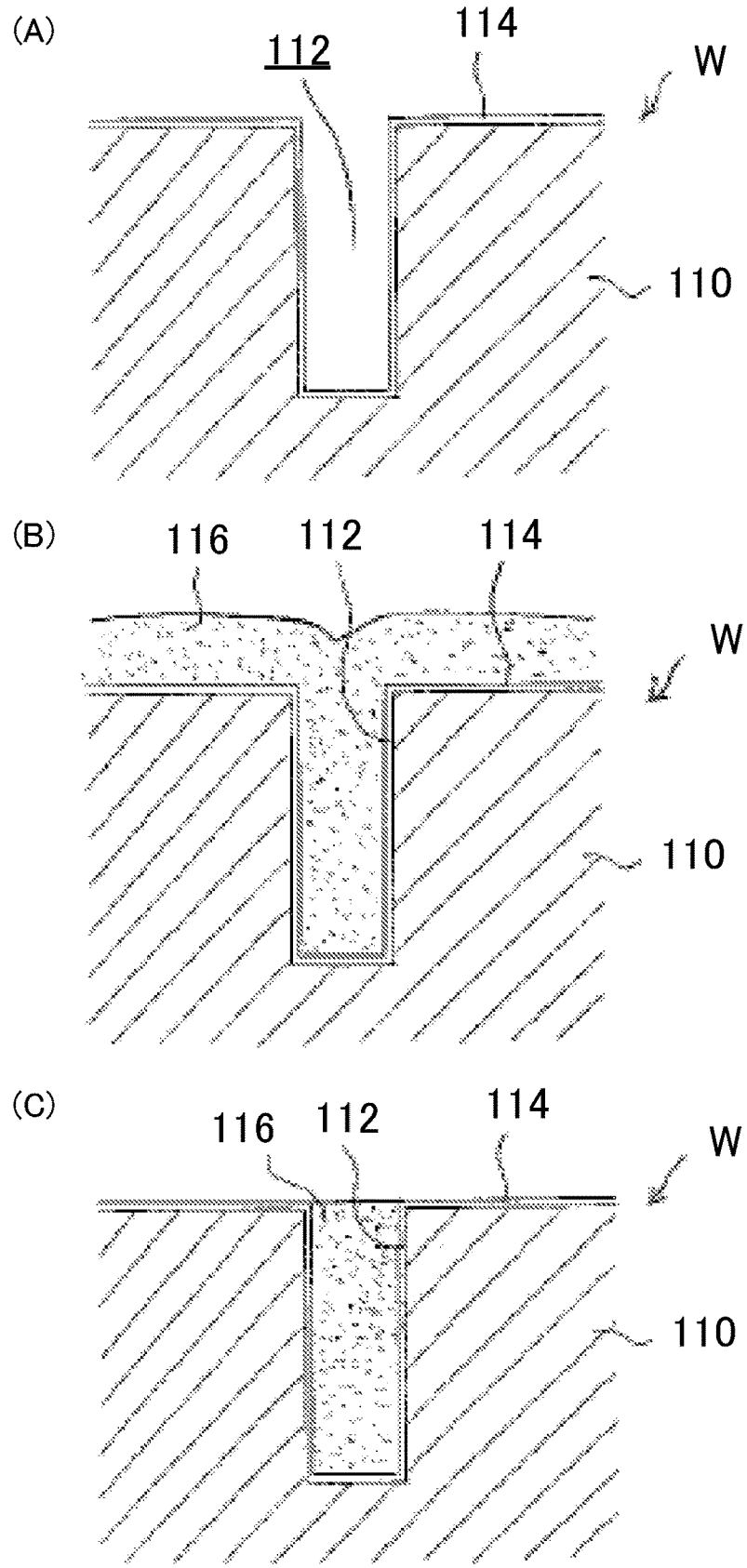
FIG. 14 is a view showing an example of manufacturing of a substrate including a through electrode.

In the plating method of the present embodiment, first, the substrate W including the via or the hole for forming the through electrode is prepared (S10). As an example, as shown in FIG. 14A, the substrate W is prepared in which a plurality of recesses 112 for the through electrodes that open upward are formed in the base material 110 made of silicon or the like, for example, by a lithography and etching technology. Each recess 112 for the through electrode has a diameter, for example, from 1 to 100 μm, preferably from 5 to 20 μm, and a depth, for example, from 70 to 150 μm. Note that in the substrate W, a hole extending through the substrate in the up-down direction may be formed in place of or in addition to the recesses (vias) for the through electrodes.

Subsequently, a plating solution tank is prepared (S20). In the present embodiment, the plating solution tank 50 in the above-described plating apparatus is prepared. The plating solution tank 50 is divided, by the diaphragm 66, into the inner space 61 (the anode tank in which the anode 40 is disposed) and the outer space (the cathode tank in which the substrate W is disposed).

Next, the anode 40 is designed and prepared (S30). Specifically, the anode 40 is designed and prepared in terms of size and shape so that current density in the anode 40 (hereinafter, referred to as "the anode current density") when plating the substrate W in the plating solution tank 50 is equal to or more than 0.4 ASD (A/cm$^2$) and equal to or less than 1.4 ASD. This is based on finding, according to investigation by the present inventors, that the consumption of the additive in the plating solution can be reduced especially when the anode current density is equal to or more than 0.4 ASD and equal to or less than 1.4 ASD. That is, if the anode current density during plating is large (e.g., in excess of 1.4 ASD), an amount of oxygen to be generated around the anode 40 increases, and the consumption of the additive in the plating solution increases. On the other hand, if the anode current density during the plating is excessively small (e.g., less than 0.4 ASD), an amount of hypochlorous acid to be generated around the anode 40 increases, and the consumption of the additive in the plating solution increases. Then, when the anode current density during the plating is equal to or more than 0.4 ASD and equal to or less than 1.4 ASD, the consumption of the additive in the plating solution can be suitably reduced. Consequently, in a process of S30, the anode 40 is designed and prepared based on the substrate W or the like to be plated so that the anode current density during the plating is equal to or more than 0.4 ASD and equal to or less than 1.4 ASD. Here, it is preferable to design the anode 40 so that the anode current density is equal to or more than 0.4 ASD, especially equal to or more than 0.5 ASD, or equal to or more than 0.6 ASD. Also, it is preferable to design the anode 40 so that the anode current density is equal to or less than 1.4 ASD, especially equal to or less than 1.3 ASD, equal to or less than 1.2 ASD, equal to or less than 1.1 ASD, or equal to or less than 1.0 ASD.

As a specific example of the design of the anode 40, first, a current amount (or a cathode current density) during the plating is determined in accordance with an area and shape of the substrate W. Here, in the present embodiment, the recesses 112 for the through electrodes are formed in the substrate W. and hence a comparatively small current amount is determined so that a defect such as a void is not caused. The current amount during the plating may only be set by using a known method. The setting does not form core of the present invention, and hence a detailed description will not be made. Then, the anode 40 is designed by determining, based on the set current amount, the size and shape of the anode 40 so that the anode current density is a desired current density. A preferable shape of the anode 40 for satisfying the current density will be described later.

Then, the substrate W prepared in S10 and the anode 40 prepared in S30 are arranged in the plating solution tank 50 prepared in S20, and electroplating is performed at the anode current density that is equal to or more than 0.4 ASD and equal to or less than 1.4 ASD (S40). It is preferable that the anode current density during the plating is equal to or more than 0.4 ASD, especially equal to or more than 0.5 ASD, or equal to or more than 0.6 ASD. Also, it is preferable that the current density during the plating is equal to or less than 1.4 ASD, especially equal to or less than 1.3 ASD, equal to or less than 1.2 ASD, equal to or less than 1.1 ASD, or equal to or less than 1.0 ASD. Thus, the anode current density is set within a predetermined range, so that the generation of oxygen and hypochlorous acid around the anode 40 can be inhibited, and the consumption of the additive in the plating solution can be reduced.

Figure 7:
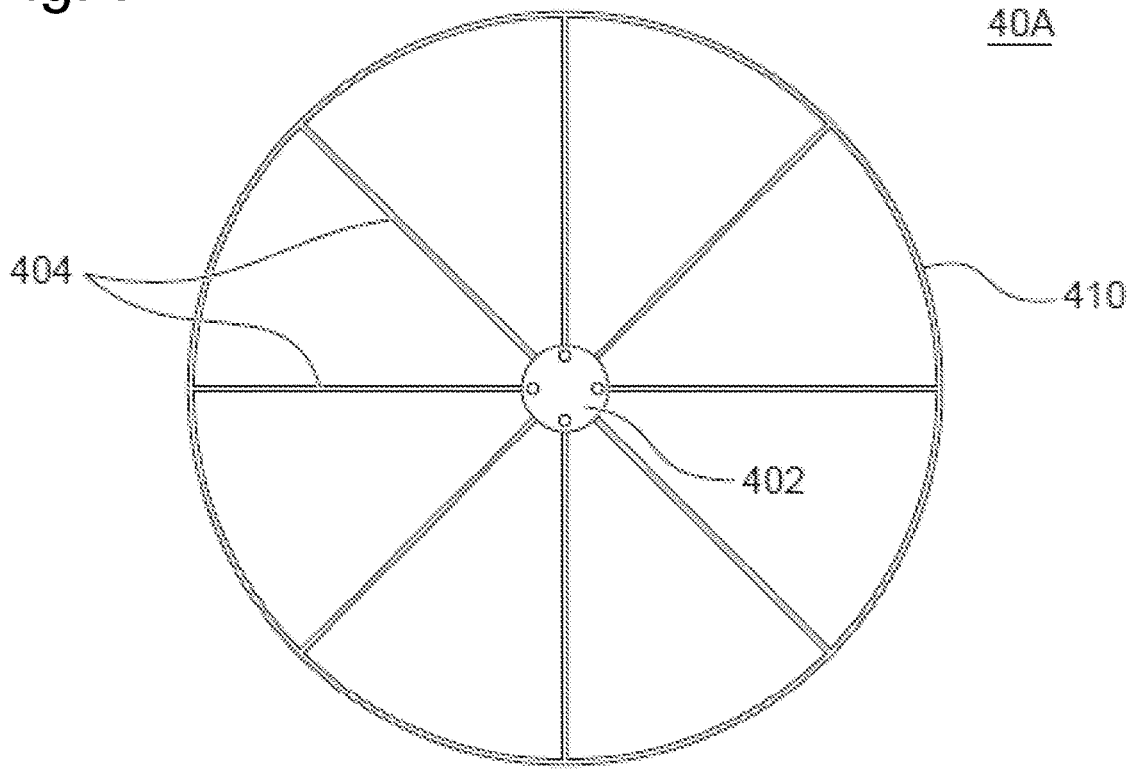
FIG. 7 is a view showing a first example of an anode in the present embodiment.

Next, a description will be made as to an example of the specific shape of the anode 40 of the present embodiment. FIG. 7 is a view showing a first example of the anode of the present embodiment. An anode 40A shown in FIG. 7 includes a power supply point 402 connected to the power source 90 via the anode holder 60, a ring electrode 410 having a ring shape around the power supply point, and a connection electrode 404 connecting the power supply point 402 and the ring electrode 410.

The power supply point 402 is connected to the power supply member 89 (see FIG. 4) of the anode holder 60. In the present embodiment, the connection electrode 404 and the ring electrode 410 are not directly connected to the power supply member 89 of the anode holder 60, but are connected via the power supply point 402. However, the present invention is not limited to this example, and at least parts of the connection electrode 404 and the ring electrode 410 may be directly connected to the power supply member 89. The power supply point 402 is circular when viewed from front (substrate W side), and a plurality of holes are formed to attach the power supply point to the power supply member 89. However, the power supply point 402 is not limited to this shape, as long as the power supply point is configured to be connectable to the power source 90.

The ring electrode 410 defines an outer edge of the anode 40A. It is preferable that an outer diameter of the ring electrode 410 is smaller than a diameter of the opening 63a of the anode holder 60. It is also preferable that an outer shape of the ring electrode 410 is substantially similar to an outer shape of the substrate W. For example, it is preferable that when the substrate W is circular, the ring electrode 410 is annular, and that when the substrate W is quadrangular, the ring electrode 410 has a quadrangular frame shape formed with four sides. In the example shown in FIG. 7, the connection electrode 404 linearly connects the power supply point 402 and the ring electrode 410. A plurality of connection electrodes 404 are provided at respective predetermined angles from the power supply point 402, and in the example shown in FIG. 7, eight connection electrodes 404 are provided radially around the power supply point 402. The ring electrode 410 and the connection electrode 404 may have about the same cross-sectional shape as a cross section that is a plane perpendicular to a longitudinal direction. For example, each of the ring electrode 410 and the connection electrode 404 may have a cross section that is a square, especially a square with each side being 1 mm, a square with each side being 2 mm, or a square with each side being 3 mm. However, the present invention is not limited to this example, and the ring electrode 410 and the connection electrode 404 may have a cross section that is, for example, rectangular, polygonal or circular.

The anode 40 is formed into this shape, and accordingly, when the plating is performed to form the through electrode in the substrate W, the consumption of the additive in the plating solution can be reduced by regulating the anode current density. Furthermore, in-plane uniformity of plating formed on the substrate W can be improved. Here, to improve the in-plane uniformity of the plating formed on the substrate W, it is preferable that the anode 40 has a rotationally symmetric shape around the power supply point 402.

Figure 8:
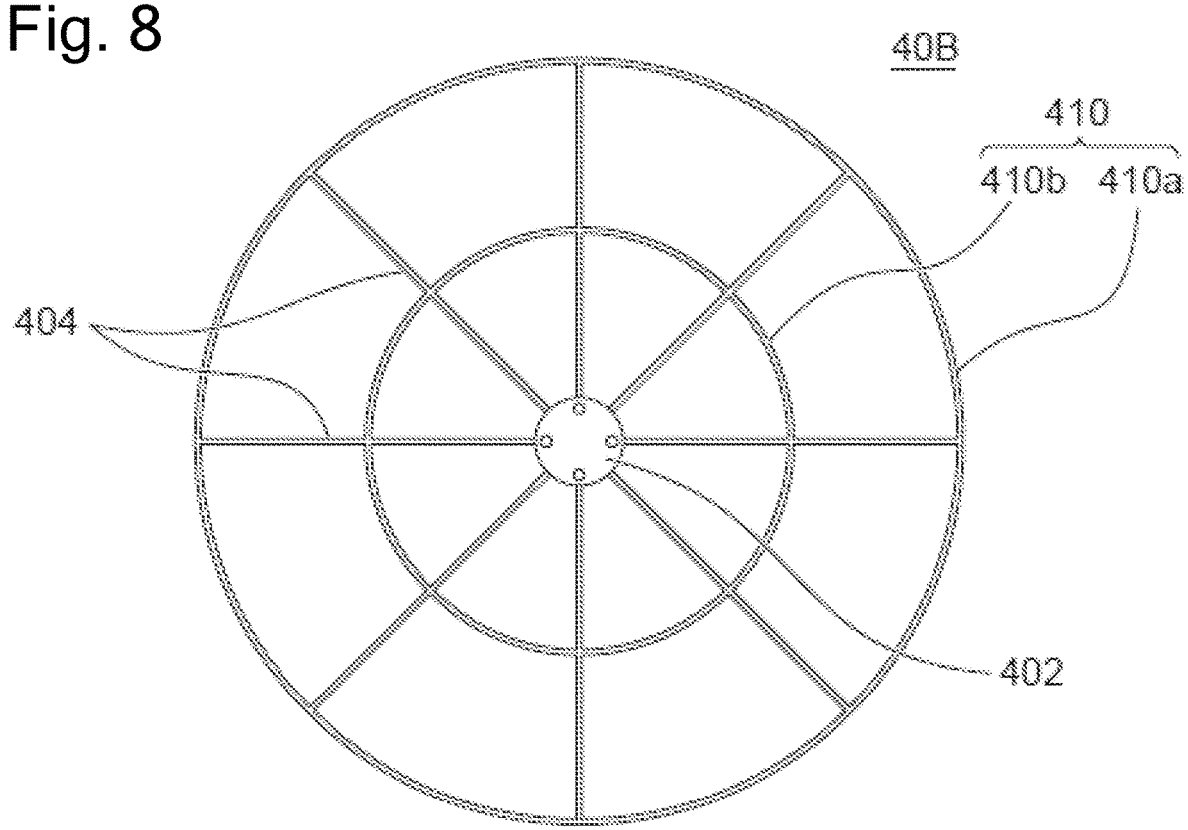
FIG. 8 is a view showing a second example of the anode in the present embodiment.

Subsequently, a description will be made as to a modification of the anode 40. FIG. 8 is a view showing a second example of the anode of the present embodiment. An anode 40B shown in FIG. 8 is different from the anode 40A shown in FIG. 7 in the ring electrode 410, and the anodes have the same shape except the ring electrode 410. The anode 40B includes, as the ring electrode 410, a first ring electrode 410a that defines an outer edge of the anode 40B, and a second ring electrode 410b having a diameter smaller than a diameter of the first ring electrode 410a. The first ring electrode 410a and the second ring electrode 410b are concentrically arranged around the power supply point 402. The first ring electrode 410a includes a configuration similar to a configuration of the ring electrode 410 of the anode 40A shown in FIG. 7, and is connected to the power supply point 402 via the connection electrode 404. In the anode 40B, the connection electrode 404 has one end connected to the power supply point 402, and the other end connected to the first ring electrode 410a. Also, the connection electrode 404 is connected to the second ring electrode 410b in an intermediate portion between the one end and the other end. Consequently, the second ring electrode 410b is connected to the power supply point 402 via the connection electrode 404. Each of the first ring electrode 410a and the second ring electrode 410b may have about the same cross-sectional shape as in the connection electrode 404, in the same manner as in the ring electrode 410 of the anode 40A.

Figure 9:
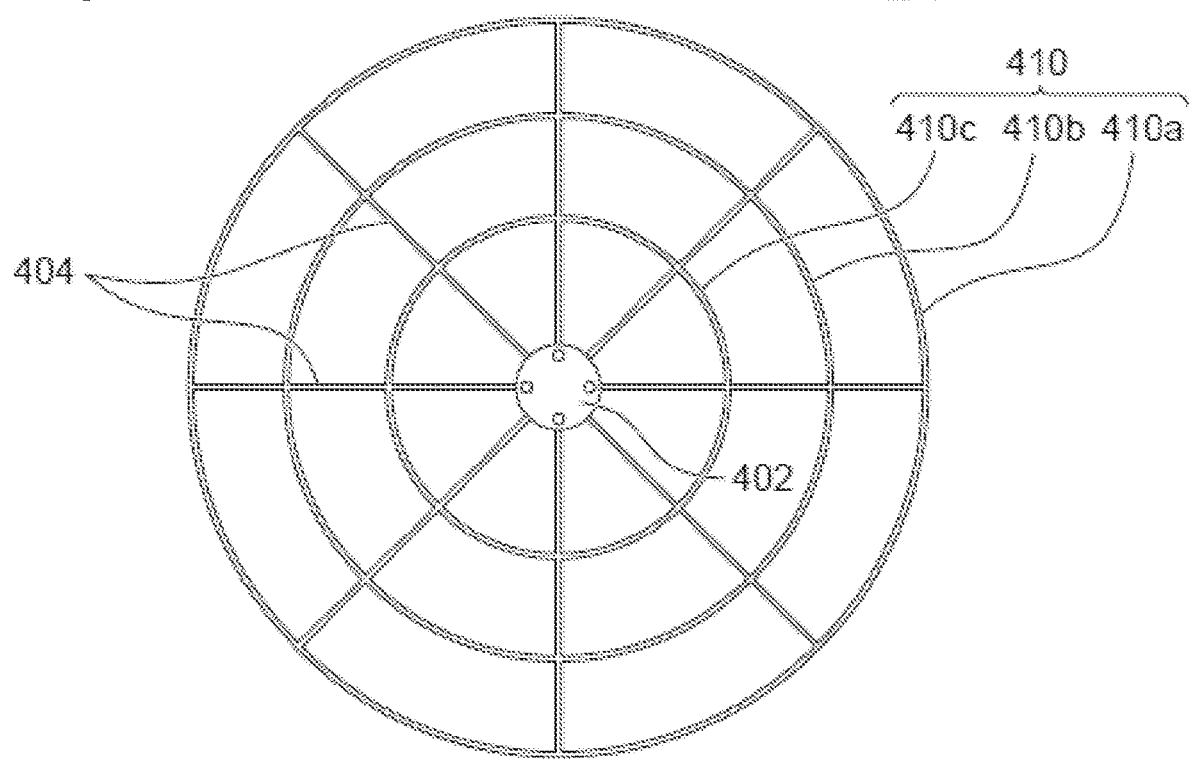
FIG. 9 is a view showing a third example of the anode in the present embodiment.

FIG. 9 is a view showing a third example of the anode of the present embodiment. An anode 40C shown in FIG. 9 is different from the anode 40A shown in FIG. 7 in the ring electrode 410, and the anodes have the same shape except the ring electrode 410. The anode 40C includes, as the ring electrode 410, a first ring electrode 410a that defines an outer edge of the anode 40C, a second ring electrode 410b having a diameter smaller than a diameter of the first ring electrode 410a, and a third ring electrode 410c having a diameter smaller than the diameter of the second ring electrode 410b. The first to third ring electrodes 410a to 410c are concentrically arranged around the power supply point 402. The first ring electrode 410a and the second ring electrode 410b have a configuration similar to a configuration of the ring electrode of the anode 40B shown in FIG. 8, and are connected to the power supply point 402 via the connection electrode 404. In the anode 40C, the connection electrode 404 is connected to the second ring electrode 410b and the third ring electrode 410c in an intermediate portion. Consequently, the second ring electrode 410b and the third ring electrode 410c are connected to the power supply point 402 via the connection electrode 404. Each of the first to third ring electrodes 410a to 410c may have about the same cross-sectional shape as in the connection electrode 404, in the same manner as in the ring electrode 410 of the anode 40A. Note that as shown in FIGS. 7 to 9, the anode 40 is not limited to the anode including one to three ring electrodes 410, and may include four or more ring electrodes 410.

Figure 10:
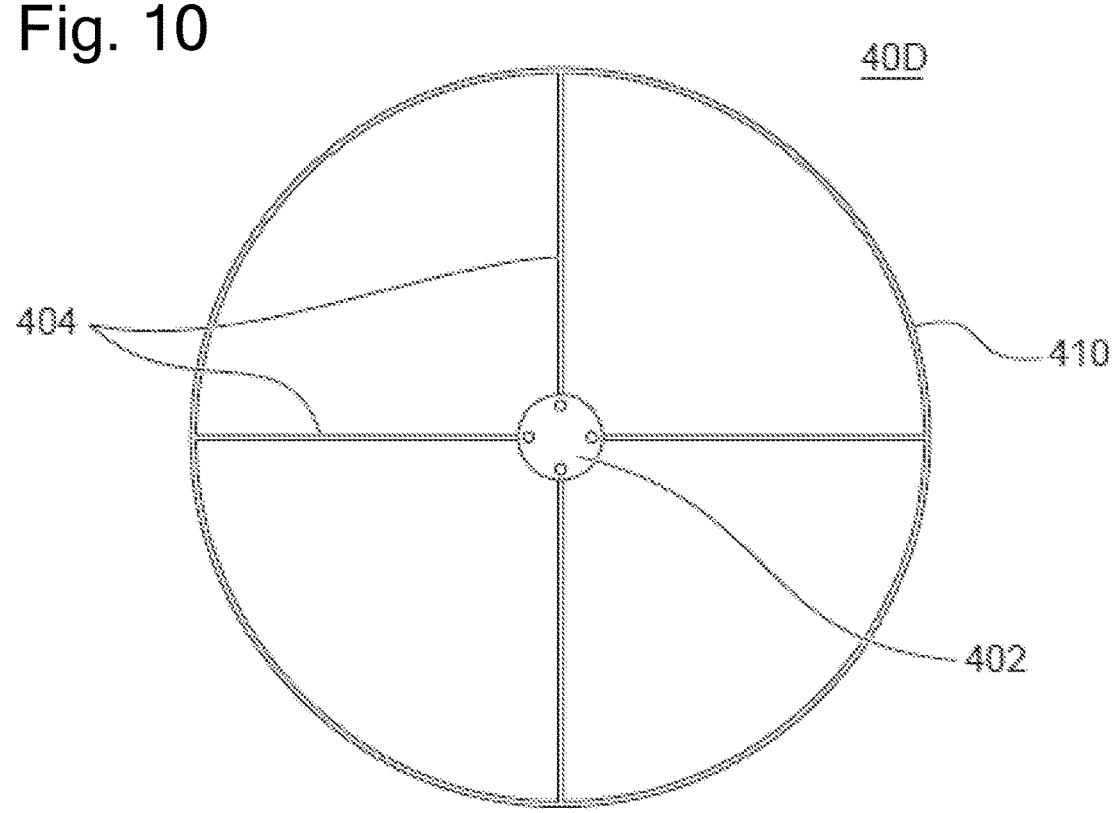
FIG. 10 is a view showing a fourth example of the anode in the present embodiment.

FIG. 10 is a view showing a fourth example of the anode of the present embodiment. An anode 40D shown in FIG. 10 is different from the anode 40A shown in FIG. 7 in the connection electrode 404, and the anodes have the same shape except the connection electrode 404. The anode 40D includes, as the connection electrode 404, an electrode extending in an up-down direction and a right-left direction and connecting the power supply point 402 and the ring electrode 410. That is, in the anode 40A shown in FIG. 7, connection electrodes 404 are arranged radially from the power supply point 402 in eight directions, but in the anode 40D shown in FIG. 10, the connection electrodes 404 are arranged radially from the power supply point 402 in four directions. Note that as shown in FIGS. 7 and 10, the anode 40 is not limited to the anode including the connection electrodes 404 arranged radially in eight directions or four directions, and may include any number of connection electrodes 404. Also, the anode 40 may include two or more ring electrodes 410 regardless of the number of the connection electrodes 404.

Figure 11:
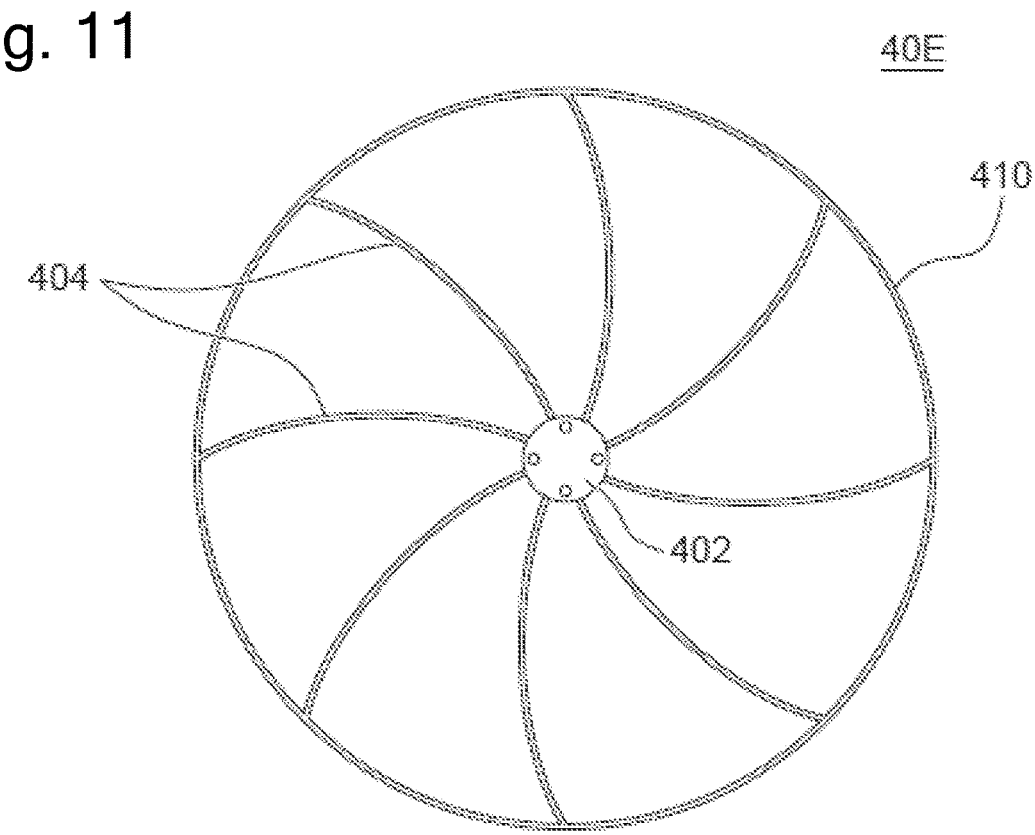
FIG. 11 is a view showing a fifth example of the anode in the present embodiment.

FIG. 11 is a view showing a fifth example of the anode of the present embodiment. An anode 40E shown in FIG. 11 is different from the anode 40A shown in FIG. 7 in the connection electrode 404, and the anodes have the same shape except the connection electrode 404. The anode 40A described above and shown in FIG. 7 includes a plurality of linear electrodes as the connection electrodes 404, but in the anode 40E shown in FIG. 11, each of a plurality of connection electrodes 404 has a curved shape. Also, in this case, it is preferable that the connection electrodes 404 are formed so that the anode 40E has a rotationally symmetric shape around the power supply point 402. Note that also in the examples shown in FIGS. 8 to 10, the connection electrode 404 may have a curved shape.

Figure 12:
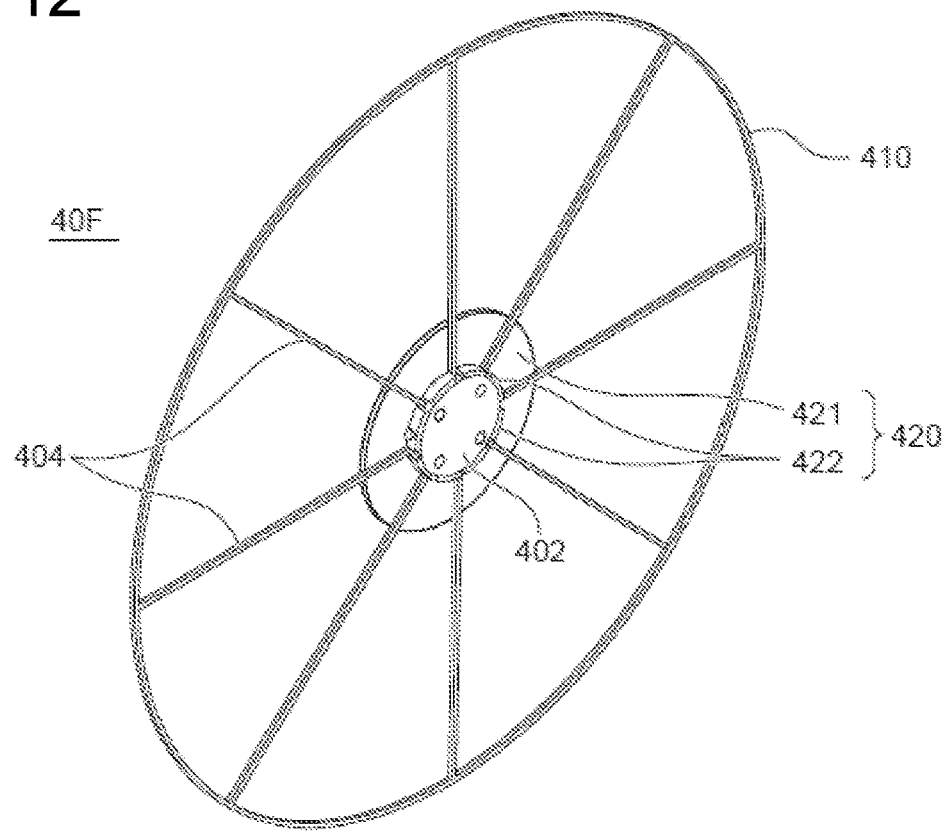
FIG. 12 is a view showing a sixth example of the anode in the present embodiment.

FIG. 12 is a view showing a sixth example of the anode of the present embodiment. An anode 40F shown in FIG. 12 is the same as the anode 40A shown in FIG. 7 except that a cover 420 is attached to the power supply point 402. The cover 420 covers a front surface in the power supply point 402 (a surface facing the substrate W) to improve the uniformity of the plating formed on the substrate W. The cover 420 may be made of a highly insulating resin such as polyvinyl chloride (PVC) or polypropylene (PP). In the example shown in FIG. 12, the cover 420 includes a plate-shaped part 421 having a circular shape with a diameter more than a diameter of the power supply point 402, and a fitting part 422 protruding rearward from the plate-shaped part 421. The plate-shaped part 421 is disposed to control an electric field on an anode surface, and may have a size determined by simulation, experiment or the like to improve the uniformity of the plating formed on the substrate W. Also, the fitting part 422 is disposed to attach the cover 420 to the power supply point 402. An inner peripheral surface of the fitting part 422 has a shape corresponding to a shape of an outer peripheral side surface of the power supply point 402. Also, the fitting part 422 includes a plurality of recesses corresponding to the connection electrodes 404 extending from the power supply point 402. According to this configuration, the cover 420 can be attached by fitting the fitting part 422 from front into the power supply point 402. However, the present invention is not limited to this example, and the cover 420 may be attached to the power supply point 402 by use of a fastener such as a screw, or an adhesive or the like. The cover 420 is disposed to cover the power supply point 402 from the front, and accordingly the uniformity of the plating formed on the substrate W can be improved. Alternatively, the cover 420 may be attached to the anodes 40B to 40E shown in FIGS. 8 to 11.

Second Embodiment

Figure 13:
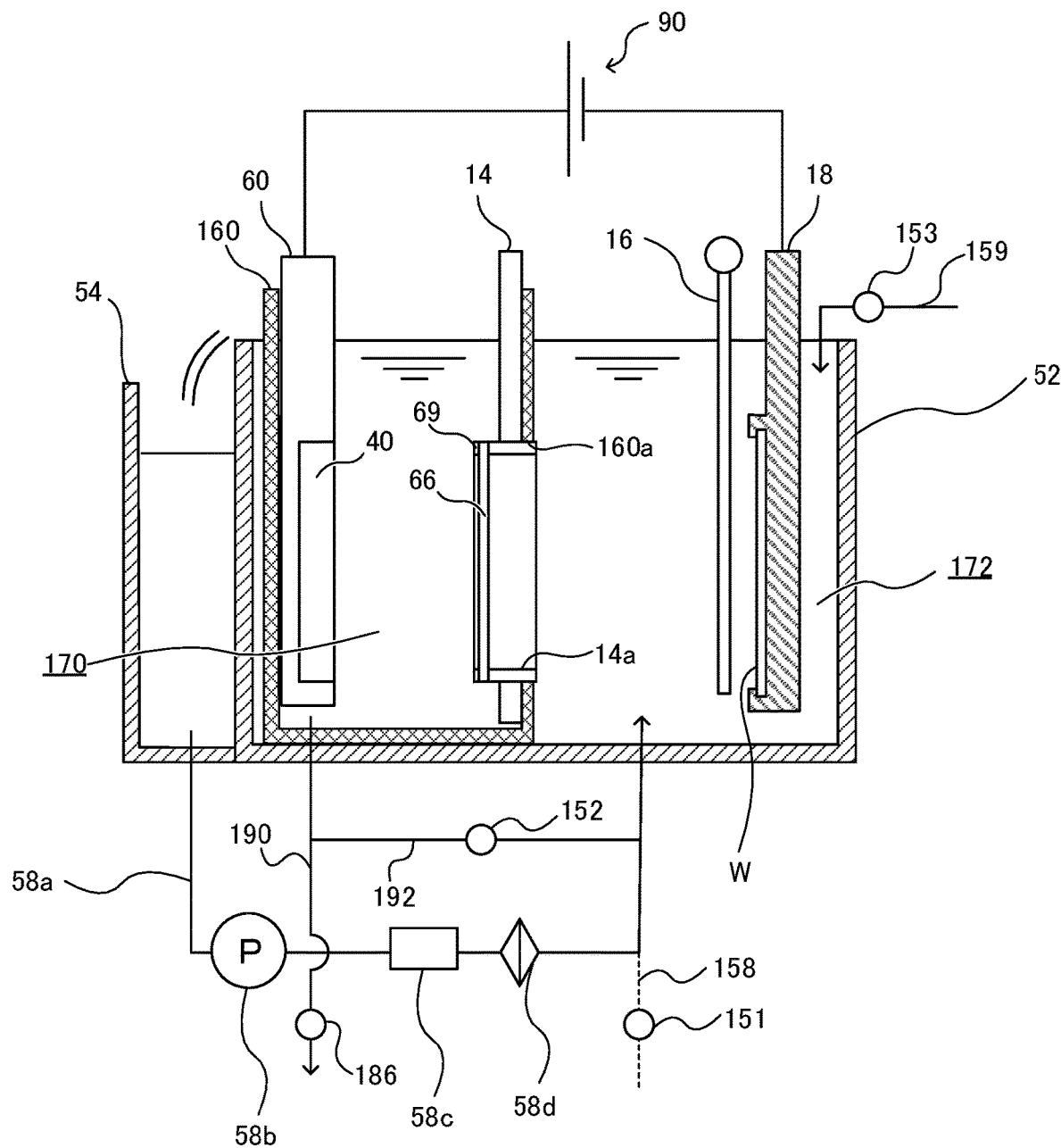
FIG. 13 is a schematic view showing a plating apparatus according to a second embodiment.

FIG. 13 is a schematic view showing a plating apparatus according to a second embodiment. The plating apparatus according to the second embodiment is different from the plating apparatus according to the first embodiment in that a diaphragm 66 is not attached to an anode holder 60, but is attached to an opening 14a in a regulation plate 14. In the following description, a description that overlaps with that of the first embodiment will not be repeated.

In the plating apparatus according to the second embodiment, a shield box 160 is disposed in a plating solution storage tank 52, and accordingly, an interior of the plating solution storage tank 52 is divided into an anode tank 170 inside the shield box 160 and a cathode tank 172 outside the shield box. In the example shown in FIG. 13, the anode holder 60 holding an anode 40 and the regulation plate 14 are arranged in the anode tank 170, and a paddle 16 and a substrate holder 18 (cathode) are arranged in the cathode tank 172.

The shield box 160 includes an opening 160a at a position corresponding to the opening 14a of the regulation plate 14. Also, a tubular part that defines the opening 14a of the regulation plate 14 is fitted into the opening 160a of the shield box 160. According to this configuration, the anode tank 170 communicates with the cathode tank 172 through the opening 14a of the regulation plate 14. Then, in the second embodiment, the diaphragm 66 is attached to the opening 14a of the regulation plate 14, and the anode tank 170 and the cathode tank 172 are divided by the diaphragm 66. Alternatively, the diaphragm 66 may be attached from an anode tank 170 side in the regulation plate 14, or may be attached from a cathode tank 172 side. Furthermore, the diaphragm 66 may be attached to the regulation plate 14 by an arbitrary method, and is attached to the regulation plate 14 by use of an annular diaphragm retainer 68 as an example.

In the plating apparatus of the second embodiment, a plating solution in the cathode tank 172 flows over a side wall of the plating solution storage tank 52 to flow into an overflow tank 54. On the other hand, the plating solution in the anode tank 170 is configured not to overflow. Further, a liquid discharge line 190 in which an on-off valve 186 is disposed is connected to the anode tank 170. For example, when the diaphragm 66 is changed, the plating solution (base liquid) in the anode tank 170 can be discharged through the liquid discharge line 190.

Also, in the plating apparatus according to the second embodiment, a base liquid supply line 158 is connected to a plating solution circulation line 58a. The base liquid supply line 158 is not intended to supply the plating solution to the plating solution storage tank 52 during plating of a substrate W, but is used to first supply the base liquid to the plating solution storage tank 52 for performing plating, that is, used only for so-called initial make-up of an electrolytic bath. The base liquid supply line 158 is provided with a first supply valve 151. Also, in the plating apparatus of the second embodiment, a connection line 192 is disposed to connect the plating solution circulation line 58a and the liquid discharge line 190. The connection line 192 is provided with a second supply valve 152. Further, the plating apparatus of the second embodiment is provided with an additive supply line 159 for supplying an additive to the cathode tank 172. The additive supply line 159 is provided with a third supply valve 153. Usually, the first to third supply valves 151 to 153 are closed.

According to the plating apparatus of the second embodiment, the first supply valve 151 and the second supply valve 152 are opened only during the initial make-up of the electrolytic bath, and the base liquid from the base liquid supply line 158 is supplied through the liquid discharge line 190 and the plating solution circulation line 58a into the anode tank 170 and the cathode tank 172. Then, the third supply valve 153 is opened, to supply the additive only to the cathode tank 172. According to this configuration, the anode tank 170 does not store the additive, and hence consumption of the additive in the vicinity of the anode 40 can be reduced.

In the plating apparatus of the second embodiment described above, the plating solution storage tank 52 is divided into the anode tank 170 and the cathode tank 172 by the shield box 160 and the regulation plate 14. Then, the diaphragm 66 is disposed in the opening 14a of the regulation plate 14. Also, in this configuration, the substrate W is plated with the anode current density being equal to or more than 0.4 ASD and equal to or less than 1.4 ASD when plating the substrate W to form the through electrode, in the same manner as in the plating apparatus of the first embodiment. Consequently, generation of oxygen and hypochlorous acid during the plating can be inhibited, and the consumption of the additive in the plating solution can be reduced.

The present embodiments described above can also be described in aspects as follows.

Aspect 1

According to Aspect 1, a plating method is provided, and the plating method includes the steps of preparing a substrate including a via or a hole for forming a through electrode, preparing a plating solution tank that is divided, by a diaphragm, into an anode tank in which an insoluble anode is disposed and a cathode tank in which the substrate is disposed, and electroplating the substrate with an anode current density when plating the substrate in the plating solution tank being equal to or more than 0.4 ASD and equal to or less than 1.4 ASD. According to this plating method, generation of oxygen and hypochlorous acid during the plating can be inhibited, and consumption of an additive in a plating solution can be reduced.

Aspect 2

According to Aspect 2, in Aspect 1, the insoluble anode includes a power supply point to be connected to a power source, a ring electrode having a ring shape around the power supply point, and a connection electrode connecting the power supply point and the ring electrode. According to Aspect 2, in-plane uniformity of plating formed on the substrate can be improved.

Aspect 3

According to Aspect 3, in Aspect 2, the ring electrode includes a first ring electrode having a first diameter, and a second ring electrode having a second diameter smaller than the first diameter.

Aspect 4

According to Aspect 4, in Aspect 2 or 3, the connection electrode linearly connects the power supply point and the ring electrode.

Aspect 5

According to Aspect 5, in Aspects 2 to 4, the insoluble anode has a rotationally symmetric shape around the power supply point.

Aspect 6

According to Aspect 6, in Aspects 2 to 5, a cover that covers a region of the power supply point of the insoluble anode facing the substrate is attached to the power supply point. According to Aspect 6, an electric field on an anode surface can be controlled by the cover, and the in-plane uniformity of the plating formed on the substrate can be improved.

Aspect 7

According to Aspect 7, in Aspects 2 to 6, the insoluble anode is held by an anode holder, the anode holder includes an opening opened to face the substrate, and a size of the ring electrode of the insoluble anode is smaller than a size of the opening.

Aspect 8

According to Aspect 8, in Aspects 1 to 7, the diaphragm is an ion exchange membrane or a neutral diaphragm.

Aspect 9

According to Aspect 9, an insoluble anode for plating that is disposed in a plating solution tank for use in the plating is provided, and the anode includes a power supply point to be connected to a power source, a ring electrode having a ring shape around the power supply point, and a connection electrode connecting the power supply point and the ring electrode. According to Aspect 9, generation of oxygen and hypochlorous acid during the plating can be inhibited, and the consumption of the additive in the plating solution can be reduced. Furthermore, the in-plane uniformity of the plating formed on the substrate can be improved.

Aspect 10

According to Aspect 10, a plating apparatus is provided, and includes a plating solution tank configured to store a plating solution, the insoluble anode for plating according to Aspect 9, and a diaphragm that divides the plating solution tank into an anode tank in which the insoluble anode is disposed and a cathode tank in which a substrate is disposed. According to Aspect 10, the plating apparatus includes the anode for plating of Aspect 9, and can exhibit effects similar to those of Aspect 9.

The embodiments of the present invention have been described above based on several examples, but the above embodiments of the present invention are described to facilitate understanding of the present invention, and do not limit the present invention. The present invention may be changed or modified without departing from the scope, and needless to say, the present invention includes equivalents to the invention. Also, in a range in which at least some of the above-described problems can be solved or a range in which at least some of effects are exhibited, any arbitrary combination or omission of respective constituent components described in the claims and description is possible.

The present application is based on and claims the benefit of priority of Japanese Patent Application No. 2019-93404 filed on May 17, 2019. All disclosed contents including the description, claims, drawings and abstract of Japanese Patent Application No. 2019-93404 are entirely incorporated herein by reference. All disclosure including the description, claims, drawings and abstract of Japanese Patent Laid-Open No. 7-11498 (PTL 1) is entirely incorporated herein by reference.

REFERENCE SIGNS LIST

- 14 regulation plate
- 14a opening
- 16 paddle
- 18 substrate holder
- 40 and 40A to 40F anode (insoluble anode)
- 50 plating solution tank
- 52 plating solution storage tank
- 54 overflow tank
- 60 anode holder
- 61 inner space
- 62 holder base
- 63 holder base cover
- 66 diaphragm
- 67 outer edge mask
- 68 diaphragm retainer
- 402 power supply point
- 404 connection electrode
- 410 ring electrode
- 410a first ring electrode
- 410b second ring electrode
- 410c third ring electrode
- 420 cover

The invention claimed is:

1. A plating method comprising the steps of:
preparing a substrate including a via or a hole for forming a through electrode;
preparing a plating solution tank that is divided, by a diaphragm, into an anode tank in which an insoluble anode is disposed and a cathode tank in which the substrate is disposed; and
electroplating the substrate with an anode current density when plating the substrate in the plating solution tank being equal to or more than 0.4 ASD and equal to or less than 1.4 ASD,
wherein the insoluble anode includes
a power supply point to be connected to a power source,
a ring electrode having a ring shape around the power supply point, and
a connection electrode connecting the power supply point and the ring electrode.

2. The plating method according to claim 1, wherein the ring electrode includes a first ring electrode having a first diameter, and a second ring electrode having a second diameter smaller than the first diameter.

3. The plating method according to claim 1, wherein the connection electrode linearly connects the power supply point and the ring electrode.

4. The plating method according to claim 1, wherein the insoluble anode has a rotationally symmetric shape around the power supply point.

5. The plating method according to claim 1, wherein a cover that covers a region of the power supply point of the insoluble anode facing the substrate is attached to the power supply point.

6. The plating method according to claim 1, wherein the insoluble anode is held by an anode holder,
the anode holder includes an opening opened to face the substrate, and
a size of the ring electrode of the insoluble anode is smaller than a size of the opening.

7. The plating method according to claim 1, wherein the diaphragm is an ion exchange membrane or a neutral diaphragm.

* * * * *